(12) United States Patent
Komori et al.

(10) Patent No.: US 6,546,034 B2
(45) Date of Patent: Apr. 8, 2003

(54) SEMICONDUCTOR LASER DEVICE, SEMICONDUCTOR LASER ARRAY DEVICE AND OPTICAL FIBER TRANSMISSION SYSTEM

(75) Inventors: Masaaki Komori, Kokubunji (JP); Masahiro Aoki, Kokubunji (JP); Kazuhisa Uomi, Hachioji (JP); Kazuhiko Hosomi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/748,175

(22) Filed: Dec. 27, 2000

(65) Prior Publication Data

US 2001/0006529 A1 Jul. 5, 2001

(30) Foreign Application Priority Data

Dec. 28, 1999 (JP) .......................... 11-372581

(51) Int. Cl.⁷ ................................. H01S 5/00
(52) U.S. Cl. .................... 372/46; 372/45; 372/50
(58) Field of Search ........................ 372/46, 45, 50, 372/36, 34

(56) References Cited

U.S. PATENT DOCUMENTS 4,338,577 A * 7/1982 Sato et al. ................... 372/36
4,547,956 A * 10/1985 Bouadma et al. ............ 372/50
5,018,158 A * 5/1991 Okada et al. ................ 372/46

FOREIGN PATENT DOCUMENTS

| JP | 58096790 A | * | 6/1983 | ............ 372/43 |
| JP | 63166284 A | * | 7/1988 | ............ 372/43 |
| JP | 63318191 A | * | 12/1988 | ............ 438/510 |
| JP | 02058287 A | * | 2/1990 | ............ 372/46 |
| JP | 05129721 A | * | 5/1993 | ............ 372/45 |

* cited by examiner

Primary Examiner—Quyen Leung
(74) Attorney, Agent, or Firm—Antonelli, Terry, Stout & Kraus, LLP

(57) ABSTRACT

A semiconductor laser device includes a semiconductor substrate, a first cladding region on one side of the semiconductor substrate, an active layer region, and a second cladding region disposed on an opposite side of the semiconductor substrate. The active layer region is disposed between the semiconductor substrate and the second cladding region. A first semiconductor region is provided on either side of the active layer region in parallel with a traveling direction of light in the active layer region and has an electric resistance higher than that of the active layer region and a refractive index higher than that of the semiconductor substrate. An insulative or semi-insulative second semiconductor region is formed between the first semiconductor region and part of the second cladding region. A first electrode and a second electrode are provided for injecting a current into the active layer region.

13 Claims, 10 Drawing Sheets

SEMICONDUCTOR LASER DEVICE, SEMICONDUCTOR LASER ARRAY DEVICE AND OPTICAL FIBER TRANSMISSION SYSTEM

BACKGROUND OF THE INVENTION

The present invention relates to a semiconductor laser device for optical communication. A single mode oscillation semiconductor laser device according to the present invention is useful for dense wavelength division multiplexing transmission.

With the spread and development of the Internet, the volume of information transmitted to each household is increased. The demand for greater volume has accelerated development of the dense wavelength division multiplexing (hereinafter abbreviated to DWDM) transmission system that enables high-volume transmission. In this system, the number of wavelengths of light transmitted through a single optical fiber is increased for higher transmission volume. On the other hand, an increase in the number of wavelengths contributes to narrowing of a channel spacing. This is because there is a limit to loss characteristics of fibers applicable to optical communication, and there is accordingly a limit to a transmission wavelength band for practical use. The narrowing of a channel spacing tends to cause crosstalk between neighboring channels. In order to avoid such crosstalk, required accuracy of transmission wavelengths is made stricter. For example, when transmission wavelengths are arranged in a wavelength band of 60 nm at a spacing of 0.8 nm, information for 64 channels or 80 channels can be transmitted. In this case, the stability of the wavelengths required in transmission is ±0.01 nm. Thus, the required yield of wavelengths of semiconductor laser devices serving as optical sources is now extremely high. Therefore, transmitting optical sources that meet such wavelength specifications are fabricated at extremely high cost.

On the other hand, in a future DWDM system, the number of transmitting optical sources required will be further increased. Accordingly, it is desired that cost for a single transmission channel be further reduced. Thus, with regard to transmitting optical sources, it is necessary to realize a semiconductor laser array in which low-cost, strongly-built, and compact semiconductor lasers with different oscillation wavelengths from each other are integrated.

A transmitting optical source used for DWDM has a wavelength selecting function for providing a single wavelength. For example, a distributed feedback laser (hereinafter abbreviated to a DFB laser), a typical example of a single mode oscillation laser, has a diffraction grating structure shaped like a saw blade in the vicinity of its optical waveguide layer. The periodicity of refractive indexes of the diffraction grating structure has an optical effect on light propagating in the waveguide. When this optical effect is specifically described, the oscillation wavelength ($\lambda$) of a single mode semiconductor laser is determined by the following equation:

$$\lambda = (2 \times n \Lambda)/m$$

where n is the equivalent refractive index of transmitting waveguide structures, $\Lambda$ is the period of the grating, and m is a degree. It is understood from this equation that in order to control oscillation wavelength accurately, it is desired to suppress variations in the equivalent refractive index (n). In order to achieve this, it is desirable to be able to control the equivalent refractive index (n) readily and accurately in device fabrication.

The equivalent refractive index (n) in the above equation is determined not only by the refractive index possessed by the material of the active layer where light propagates, but also by the shape and dimensions of the active layer and the refractive index of a structure around the active layer. Therefore, in order to control oscillation wavelength accurately, it is also necessary to control the shape and dimensions of the active layer of a semiconductor laser device and suppress variations in the refractive index of the structure around the active layer.

Basic structures of conventional semiconductor lasers are roughly divided into a gain-guide type structure and a refractive index waveguide type structure. A typical example of a gain-guide type semiconductor laser is a ridge waveguide semiconductor laser. In fabricating a ridge type semiconductor laser, a semiconductor laminate structure that serves as a base is formed by a single crystal growth process. Thereafter, while leaving a light emitting region, an upper cladding layer, which is a region that sandwiches the light emitting region, is etched, and is then buried in a polyimide resin.

On the other hand, a refractive index waveguide type semiconductor laser, which is typified by a buried heterostructure laser device, has a buried heterostructure in which only the waveguiding region for light in the semiconductor laminate is made to remain, and the other regions are buried in substrate material. In a process of fabricating this single mode oscillation semiconductor laser, a current blocking layer is formed by a regrowth process step after etching.

SUMMARY OF THE INVENTION

The process of fabricating the structure of the above-mentioned ridge waveguide semiconductor laser is simple, and therefore, in the case of Fabry-Perot lasers, the yield of their fabrication is very high. The side walls of the ridge shape of the upper cladding layer are covered with polyimide. Therefore, a relative refractive index difference between the active layer formed by semiconductor material and the ridge sides formed by non-semiconductor material is very large. Thus, reflecting variations in the equivalent refractive index (n) caused by variations in active region width on the ridge side, variations in the oscillation wavelength of the single mode oscillation laser become significant.

On the other hand, in the case of the buried heterostructure semiconductor laser, nonuniformity in the structure of its active region is significant, as compared with the ridge waveguide semiconductor laser. Thus, variations in the equivalent refractive index of the buried heterostructure semiconductor laser proper become significant, thereby making it difficult to control the oscillation wavelength accurately.

Moreover, DWDM transmitting optical sources present a problem other than that of the precision of oscillation wavelength in device fabrication. The problem is a drift of lasing wavelength resulting from secular changes of a transmitting optical source itself mounted in a system. In order to deal with this problem, development of wavelength variable lasers to be used as transmitting optical sources has been conducted. The wavelength variable laser is a single mode oscillation semiconductor laser mounted with a heater, so that its oscillation wavelength is changed by heating the active layer. The heating of the active layer, however, impairs characteristics of the semiconductor laser. Therefore, in the development of DWDM transmitting optical sources, it is essential to fabricate a single mode oscillation semiconductor laser that can oscillate at a required wavelength with accuracy and to improve temperature characteristics of the semiconductor laser itself for use as a wavelength variable laser. Factors in the impairment of temperature characteristics of conventional semiconductor lasers will be described in the following. In the above-mentioned ridge waveguide semiconductor laser, carriers injected into the active layer are diffused laterally as the temperature of the active layer rises. Therefore, it becomes necessary to inject an excess amount of carriers to compensate for a decrease in gain resulting from the temperature rise.

In the case of the buried heterostructure semiconductor laser, there is a decrease in electric resistance in the vicinity of an interface between the etched active layer and the semiconductor material for burying the active layer. Thus, as the temperature of the active layer rises, carriers flow out through this region, and therefore are not effectively injected into the active layer.

In view of the technical background described above, it is a first object of the present invention to provide semiconductor laser devices and semiconductor laser array devices that can ensure high-precision oscillation wavelengths.

It is a second object of the present invention to provide semiconductor laser devices and semiconductor laser array devices that are less affected by the atmospheric temperature while ensuring high-precision oscillation wavelengths.

It is a third object of the present invention to provide semiconductor laser devices and semiconductor laser array devices that make it possible to achieve the first or second object described above and also ensure a certain yield level in fabrication.

According to the present invention, it is possible to provide single mode oscillation semiconductor laser devices and semiconductor laser array devices that have such characteristics as described above.

It is another object of the present invention to provide optical systems or optical fiber transmission systems that enable transmission at stable wavelengths.

Main points of the present invention will be described with reference to an example in FIG. 1. FIG. 1 is a perspective view of a semiconductor laser device according to the present invention. The figure shows two laser structures; a laser structure 1 on the left side is a schematic view of the semiconductor laser device and the other laser structure on the right side is a partially sectioned view of the semiconductor laser device for facilitating understanding of the device structure.

On a semiconductor substrate 11, a buffer layer 12 and a cladding layer 13 (also commonly referred to as an optical guide layer) on the substrate side are formed. On the cladding layer 13, an active layer region 4 and an upper cladding layer 21 are disposed. Thus, the active layer region 4 forms an optical waveguide. Generally, the active layer region 4 has a quantum-well structure. The quantum-well structures generally applied to semiconductor laser devices include, for example, a single quantum-well structure, a multiple quantum-well structure, a strained quantum-well structure, or a strain-compensated quantum-well structure. Such structures can be used according to the requirements of a semiconductor laser device to be employed. Incidentally, in this case, a strained quantum-well structure is adopted as a concrete example.

In order to ensure oscillation in single mode operation, it is particularly desirable to use a diffraction grating 10 for optical feedback. In addition to the DFB type laser of this example, in the present invention, a so-called DBR (Distributed Bragg Reflection) type laser employing a diffraction grating is desirable. Desirable arrangements of the diffraction grating will be shown in concrete structures illustrated in several embodiments to be described later. However, it is needless to say that a given diffraction grating for optical feedback may be disposed at a location on a layer or in a region that is not described in the present specification. In other words, it is sufficient if the structure enables DFB type or DBR type laser oscillation. Of course, regardless of the type of optical feedback means, the basic concept of the present invention of providing a first current blocking layer region and a second current blocking layer region, which will be described below, provides sufficient current blocking effects.

According to a representative aspect of the present invention, a first current blocking layer region 3 having the characteristics described below is provided so as to sandwich an active layer region of the semiconductor laser device. Of course, the first current blocking layer region is disposed on both sides of the optical resonator so as to intersect a traveling direction of light.

It may be said that a region corresponding to the first current blocking layer region 3 has an electric resistance different from that of the active layer region of the semiconductor laser device and has a refractive index higher than that of substrate material. The first current blocking layer 3 or the region having an electric resistance different from that of the active layer region of the semiconductor laser device and having a refractive index higher than that of substrate material is typically formed by implanting ions into a fundamental semiconductor laminate that forms the semiconductor laser device.

According to another aspect of the present invention, a second current blocking layer region 6 formed by semi-insulating semiconductor material is disposed on the first current blocking layer region 3. It is also an important aspect from a practical point of view that the second current blocking layer region 6 is formed in a self-aligned relation with the first current blocking layer region 3, and therefore the width of the second current blocking layer region 6 is thus determined. In a specific example of forming the second current blocking layer 6, the first current blocking layer region 3 is formed by ion implantation, and then a mask used for the ion implantation is utilized to selectively form the second current blocking layer region 6 by crystal growth.

DESCRIPTION OF THE PREFERRED EMBODIMENTS

Figure 1:
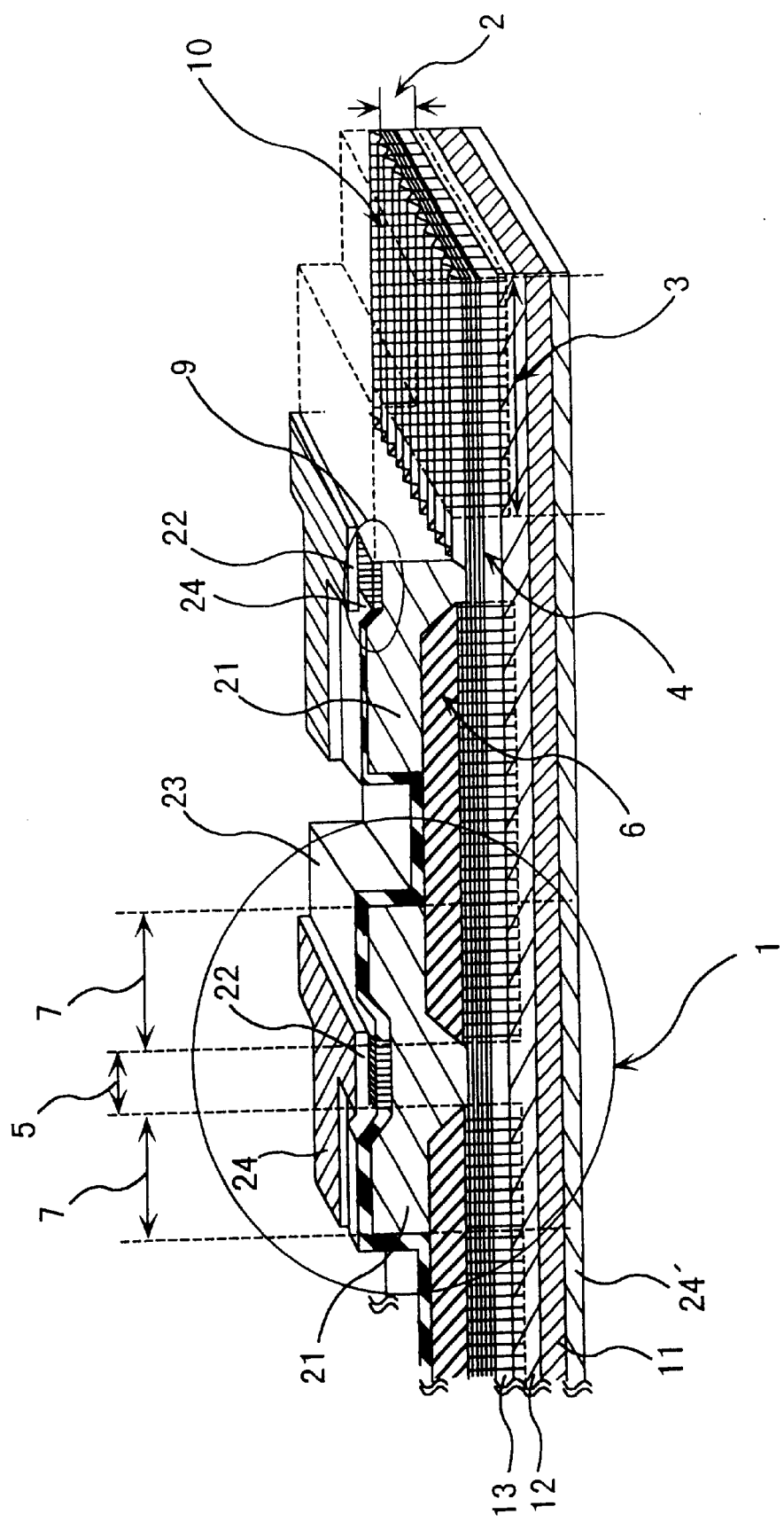
FIG. 1 is a perspective view of a semiconductor laser array device for explaining main points of the present invention.

Prior to explanation of preferred embodiments of the present invention, embodiments of the current blocking layer regions 3 and 6, which are the main points of the above-mentioned first and second aspects of the present invention, will now be described in more detail with reference to FIG. 1. In FIG. 1, a current injection range is denoted by reference numeral 5, and a current blocking layer region is denoted by reference numeral 7. The current blocking layer region 7 is defined by the two current blocking layer regions 3 and 6. In FIG. 1, reference numeral 11 denotes a semiconductor substrate; reference numeral 12 denotes a buffer layer; reference numeral 13 is a cladding layer (also referred to as an optical guide layer); reference numeral 2 is a strained quantum-well structure; reference numeral 6 denotes a semiconductor layer whose main component has insulative or semi-insulative properties; reference numeral 9 denotes an uneven section; reference numeral 10 denotes a region where a diffraction grating is formed; reference numeral 21 is an upper cladding layer; reference numeral 22 is a contact layer; reference numeral 23 is an insulator layer; reference numeral 24 denotes a first electrode; and reference numeral 24' denotes a second electrode.

In a device structure according to the present invention, ions are implanted into a semiconductor laminate region that forms an active layer region, for example the typical strained multiple quantum-well layer 2, whereby a region 3 corresponding to the first current blocking layer region can be formed. A region where ions are not implanted forms an active layer region 4 in a semiconductor laser device 1. Ion implantation techniques are effective as a process for covering a large area with a high degree of uniformity because etching and regrowth are not used in the process steps. Any kind of ion can be applied in this ion implantation as long as it is able to form a current path in the semiconductor material used for the active layer region 4. Typical examples of such ions include protons, oxygen, and iron. Elements having great masses are useful especially for improvement of dimensional accuracy. Such elements are, for example, heavy metal elements such as iron. This is because lateral diffusion of ions in ion implantation is reduced when such elements are used. On the other hand, with light elements such as protons, lateral diffusion of ions is increased, and therefore effects of improving dimensional accuracy in forming the current injection range 5 tend to be reduced. As for the amount of ions to be implanted, it will be sufficient if the concentration of the ions is high enough to render the semiconductor layer insulating or semi-insulating material. In the case of compound semiconductor material InP, the concentration represents about $1 \times 10^{18}$ atoms/cm$^2$ or higher.

It will also be sufficient if the current blocking layer region 3 is thick enough to cover at least both sides of the light emission active layer region.

Next, a second current blocking layer region according to the present invention will be described in detail.

A region corresponding to the second current blocking layer region can typically be obtained by selectively regrowing a semi-insulative InP crystal on the first current blocking layer 3. The second current blocking layer 6 is selectively grown after a dielectric film such as SiO$_2$ film is deposited directly on the active layer region 4. In this case, the concentration of iron included in the second current blocking layer 6 is about $4 \times 10^{17}$ to $3 \times 10^{18}$/cm$^3$, which is a generally employed level. The concentration of the iron is set on the assumption that the iron at least has semi-insulating properties in semiconductor material.

The thickness of the second current blocking layer region 6 or an at least semi-insulative semiconductor material layer is set at about 0.6 $\mu$m or more.

The width 5 of a current injection region (hereinafter abbreviated to the active region width) formed in the active layer region by regrowth of the crystal is determined by the dielectric film for selective growth. Accordingly, the accuracy of the active region width 5 is determined only by the accuracy of photolithography in patterning the dielectric film for selective growth. Thus, dimensional accuracy in fabrication is to be increased in the active layer region 4.

Figure 2:
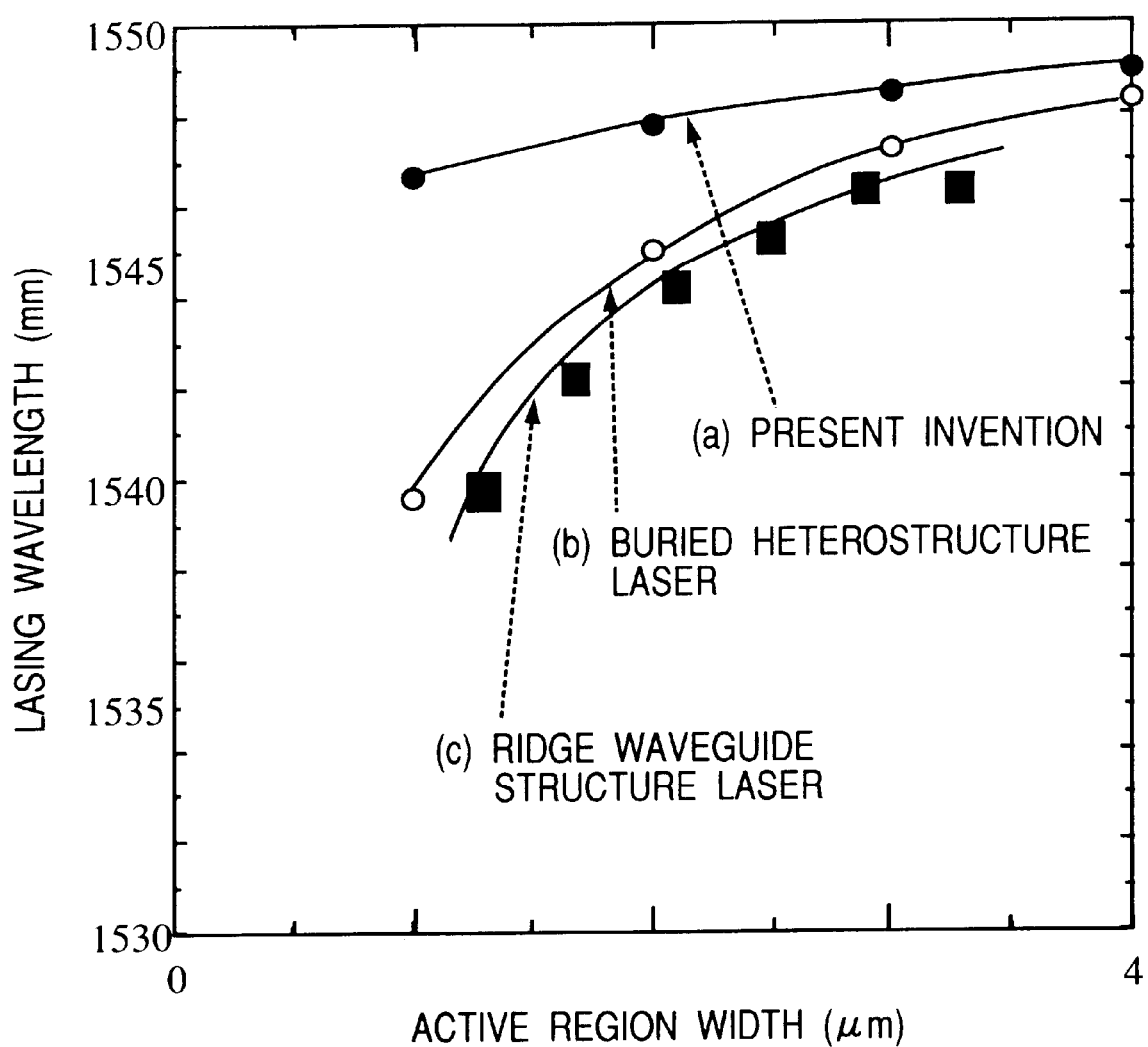
FIG. 2 is a graph showing relations between active region widths and oscillation wavelengths of a semiconductor laser device according to the present invention and other types of semiconductor laser devices.

Next, effects of the first current blocking layer region and the second current blocking layer region according to the present invention will be illustrated. FIG. 2 shows a comparison of dependence of oscillation wavelengths on active region width in the following device structures: a single mode oscillation semiconductor laser device of the above-mentioned buried heterostructure, a single mode oscillation semiconductor laser device of a reversed-mesa ridge waveguide structure, and the present invention. The axis of abscissas denotes active region width ($\mu$m), and the axis of ordinates denotes oscillation wavelength (nm) in single mode operation. It should be noted that in the case of the present invention, the active region width corresponds to a width indicated by reference numeral 5 in FIG. 1. Also in the cases of the other semiconductor laser devices, the active region width corresponds to the width of similar regions.

The semiconductor laser device of the reversed-mesa ridge waveguide structure used for comparison has an n-type InP layer on an n-type InP substrate, an active layer region on the n-type InP layer, and a p-type InP layer as an upper cladding layer. The p-type InP layer has a reversed-mesa structure, and both sides of the reversed-mesa structure are buried in a polyimide resin. The reversed-mesa structure has a width that is substantially an active region width in the vicinity of an active layer region, and is extended in a traveling direction of light. On the other hand, the semiconductor laser device of the buried heterostructure used for comparison has a p-type InP layer on a p-type InP substrate, and an active layer region on the p-type InP layer. The active layer region and the p-type InP layer form a mesa structure, and both sides of the mesa structure are buried in the next semiconductor layer. The active layer and the semiconductor layer are an n-type InP layer and a p-type InP layer, respectively. An n-type InP layer is further provided on the whole upper surface of the resulting structure. The burying layer has a function as a current blocking layer, and a region of the mesa structure serves as an active region.

Results shown in FIG. 2 indicate that oscillation wavelength of the device structure (a) according to the present invention is least dependent on active region width. The characteristics of the ridge waveguide structure (b) and the buried heterostructure (c) are similar to each other.

The present invention has an advantage in characteristics because the equivalent refractive index (n) of a region corresponding to the active region width 5 is not easily affected by changes in the active region width 5. More specifically, in the structure according to the present invention, the active layer region 4 and the first current blocking layer region 3 are formed on the basis of the same material, that is, the strained multiple quantum-well layer 2. Accordingly, a difference in refractive indexes between the active layer region 4 and the first current blocking layer region 3 is smaller than those of the semiconductor lasers of the buried heterostructure and the like.

In the case of the semiconductor laser of the ridge waveguide structure, a portion corresponding to the second current blocking layer region 6 of the structure according to the present invention is formed by a polyimide resin, which is an organic resin. Therefore, a difference in refractive indexes between the organic resin in that region and semiconductor material in an active layer region is large, and thus the equivalent refractive index around the active layer region reflects even slight changes in dimensions. In the semiconductor laser of the buried heterostructure, the second current blocking layer region 6 has the same refractive index as that of the corresponding region in the structure of the present invention. However, the refractive index of a region corresponding to the first current blocking layer region 3 in the structure of the present invention is the same as that of the material of the substrate 11. Thus, effects of the optical waveguide in the buried heterostructure are inferior to those of the present invention.

The above considerations show that the present invention is superior to the conventional semiconductor lasers of the ridge waveguide structure and the buried heterostructure in terms of the stability of oscillation wavelength to be ensured in fabrication.

As is understood from the above description, the fundamental point to be considered in the present invention is to make a difference in equivalent refractive indexes between the active region width 5 and the current blocking region 7 smaller than those of the semiconductor lasers of the ridge waveguide structure and the buried heterostructure. Therefore, according to the present invention, any combination of layer structures can be conceived with an object of bringing the equivalent refractive index of the current blocking region 7 close to that of the active region width 5. Of course, however, it is needless to say that the equivalent refractive index of the current blocking region 7 is set in a range that exceeds the refractive index of the InP substrate but does not exceed the refractive index of the active layer region.

For example, in the case of the structure shown in FIG. 1, an organic resin, for example a thermosetting organic resin such as a polyimide resin as a typical example may be disposed on the second current blocking layer region 6 in the current blocking region 7. In addition to the polyimide resin, resins used for this purpose include a polyimideamide resin and a polyamide resin. In this case, although a polyimide-based resin or the like is used, a difference in refractive indexes between the active region width 5 and the current blocking layer region 7 can be made smaller than those of the conventional semiconductor lasers of the ridge waveguide structure and the buried heterostructure because of the presence of the second current blocking layer region 6. This structure may be required, depending on how a semiconductor optical device is mounted in a module.

The polyimide-based resin mentioned above is used in the following case, for example. In the semiconductor laser section 1 shown in FIG. 1, the final form of the structure has an uneven shape 9 that is left in the vicinity of an electrode. The presence of the second current blocking layer region 6 creates a difference in the thickness of the substrate for crystal growth. Then, the second current blocking layer 6 is buried in the substrate for crystal growth having an uneven portion by crystal growth using a semiconductor material. As a result, the uneven shape 9 is formed in the vicinity of an electrode. Therefore, when flattening of the surface of a semiconductor optical device is required in mounting, a convex region of the uneven shape 9 is etched down to the vicinity of the second current blocking layer 6, and then the removed portion is filled with polyimide. Thus, it is possible to provide a device having a flat surface structure. It is needless to say that also in this case, it is possible to achieve the original object of the present invention.

Next, a case in which a semiconductor optical device is made to have a plurality of laser structures, that is, made into an array device will be described.

In order to reduce manufacturing cost per single channel in a dense wavelength division multiplexing transmission system, it is desirable to employ an array-type transmitting optical source in which single mode oscillation semiconductor lasers are integrated on a single substrate. In this case, it is necessary to vary oscillation wavelengths of adjacent single mode oscillation semiconductor lasers, and control the channel spacing with high accuracy. A method for achieving this will be described in the following. In order to achieve this, the period ($\Lambda$) of a diffraction grating formed for each semiconductor laser structure is varied. The method of changing the period of a diffraction grating can be carried out by using an existing electron beam printing apparatus or the like.

The method of changing the period of a diffraction grating can be used for both of the above-mentioned DFB type and DBR type semiconductor lasers.

Next, it will be shown that the structure described above also has an effect of improving the temperature characteristics of a semiconductor laser. This effect is important in providing a wavelength variable function of the heating type to a semiconductor laser. In the structure according to the present invention, the first current blocking layer 3 is provided on the side of the active layer region 4. Therefore, lateral diffusion of carriers as in a semiconductor laser of the ridge waveguide structure does not occur.

In addition, when the first current blocking layer 3 is produced by ion implantation, a decrease in electric resistance in the vicinity of an interface between the active layer region and the semiconductor layer used for burying the active layer region does not occur since the semiconductor layers as main materials are preformed as a single layer. Thus, leakage of current in the vicinity of the interface is reduced, thereby making it possible to suppress idle current that does not contribute to oscillation during high-temperature operation.

In order to further improve the temperature characteristics of a semiconductor laser, it is preferable to set the structure of the active layer region 4 to be an n-type modulation doped structure. When the active layer region has a quantum-well structure, threshold current density of the semiconductor laser device is reduced by subjecting the barrier layer to n-type doping. The threshold current density is reduced because lateral diffusion of carriers in the active layer is suppressed by doping the barrier layer with an n-type impurity. In general, on the other hand, when the doping density of the barrier layer is $3\times10^{18}/cm^3$ or more, the threshold current density is increased. This is because the n-type impurity is increased too much and thereby optical loss within the active layer is increased. The reduction of threshold current density leads to suppression of the amount of carrier injection during high-temperature operation, and hence to an improvement in temperature characteristics of the semiconductor laser. Moreover, when iron is implanted in the first current blocking layer 3 in the structure of the present invention, the current blocking layer functions as an electron trap, thereby making it possible to further suppress lateral diffusion of carriers. Thus, in order to effectively realize the structure of the present invention, it is preferable to perform n-type doping of the active layer region 4 at a density of $3 \times 10^{18}/cm^3$ or less.

The present invention can be carried out in semiconductor optical devices using semiconductor material, especially compound semiconductor material. For semiconductor laser devices for optical communication, III–V compound semiconductor materials or, above all, InGaAsP materials are desirable. Of course, the present invention is effective also when compound semiconductor materials containing other elements such as the Al element or III–VI compound semiconductor materials are used. Examples of III–V compound semiconductor materials for forming the quantum-well structure in question include: GaAs/AlGaAs, GaAsP/AlGaInAs, GaInAs/AlGaInAs, GaInAs/AlInAs, GaInAs/AlGaAsP, GaInP/AlGaInP, AlGaInP/AlGaInP, GaInAsP/AlGaInP, GaInAsP/GaInP, GaInAsP/GaInAsP, GaInAsP/InP, GaInAs/InP, InGaAlN/InGaAlN, AlGaN/GaN, AlGaN/AlGaN, GaInNAs/GaAs, GaInNAs/AlGaAs, GaInNAs/InGaAs, and GaInNAs/InAlGaAs.

Representative aspects of the present invention will hereinafter be described.

According to a first aspect of the present invention, there is provided a semiconductor laser device comprising a semiconductor substrate; a first cladding region on a side of the semiconductor substrate; an active layer region; a second cladding region disposed over a same side of the semiconductor substrate as that on which the first cladding region is on and with the active layer region being intermediate that between the semiconductor substrate and the second cladding region; a first semiconductor region on either side of the active layer region in parallel with a traveling direction of light in the active layer region, the first semiconductor region having an electric resistance higher than that of the active layer region and a refractive index higher than that of the semiconductor substrate; an insulative or semi-insulative second semiconductor region formed between the first semiconductor region and part of the second cladding region; and a first electrode and a second electrode for injecting a current into the active layer region.

According to a second aspect of the present invention, there is provided a semiconductor laser device comprising a semiconductor substrate; a first cladding region on a side of the semiconductor substrate; an active layer region; a second cladding region disposed over a same side of the semiconductor substrate as that on which the first cladding region is on and with the active layer region being intermediate that between the semiconductor substrate and the second cladding region; a first semiconductor region on either side of the active layer region in parallel with a traveling direction of light in the active layer region, the first semiconductor region having an electric resistance higher than that of the active layer region and guiding the light; an insulative or semi-insulative second semiconductor region formed in a self-aligned relation with the first semiconductor region between the first semiconductor region and part of the second cladding region; and a first electrode and a second electrode for injecting a current into the active layer region.

According to a third aspect of the present invention, there is provided a semiconductor laser device comprising an active layer region; a first cladding region on a semiconductor substrate side for crystal growth; a second cladding region disposed over a same side of the semiconductor substrate as that on which the first cladding region is on and with the active layer region being intermediate that between the semiconductor substrate and the second cladding region; a first current blocking layer region disposed on either side of the active layer region in parallel with a traveling direction of light in the active layer region; a second current blocking layer region disposed on the first current blocking layer region; and a first electrode and a second electrode for injecting a current into the active layer region, wherein the first current blocking layer region has an electric resistance higher than that of the active layer region and a refractive index higher than that of the semiconductor substrate.

According to a fourth aspect of the present invention, there is provided a semiconductor laser device comprising a semiconductor substrate; a first cladding layer region on a side of the semiconductor substrate; a region of quantum-well structure; a second cladding layer region disposed over a same side of the semiconductor substrate as that on which the first cladding layer region is on and with the region of quantum-well structure being intermediate that between the semiconductor substrate and the second cladding layer region; a first semiconductor region disposed on either side of a resonator-forming region of the quantum-well structure region, the side of the resonator-forming region being in parallel with a traveling direction of light, and the first semiconductor region having an electric resistance higher than that of the quantum-well structure region and a refractive index higher than that of the semiconductor substrate; an insulative or semi-insulative second semiconductor region formed in a self-aligned relation with the first semiconductor region between the first semiconductor region and part of the second cladding region; and a first electrode and a second electrode for injecting a current into the quantum-well structure region.

According to a fifth aspect of the present invention, there is provided a semiconductor laser device comprising a semiconductor substrate; a first cladding region on a side of the semiconductor substrate; a region of quantum-well structure; a second cladding region disposed over a same side of the semiconductor substrate as that on which the first cladding region is on and with the region of quantum-well structure being intermediate that between the semiconductor substrate and the second cladding region; a first semiconductor region disposed on either side of a resonator-forming region of the quantum-well structure region, the side of the resonator-forming region being in parallel with a traveling direction of light, and the first semiconductor region having an electric resistance higher than that of the quantum-well structure region and a refractive index higher than that of the semiconductor substrate; an insulative or semi-insulative second semiconductor region formed between the first semiconductor region and part of the second cladding region; and a first electrode and a second electrode for injecting a current into the quantum-well structure region.

According to a sixth aspect of the present invention, there is provided a semiconductor laser device comprising a semiconductor substrate; a region of quantum-well structure; a first cladding layer region on a side of the semiconductor substrate and a second cladding layer region disposed over a same side of the semiconductor substrate as that on which the first cladding layer region is on and with the region of quantum-well structure being intermediate that between the first cladding layer region and the second cladding layer region; a first semiconductor region disposed on either side of a resonator-forming region of the quantum-well structure region, the side of the resonator-forming region being in parallel with a traveling direction of light, and the first semiconductor region having an electric resistance higher than that of the quantum-well structure region and being capable of guiding light; an insulative or semi-insulative epitaxial semiconductor layer region formed in a self-aligned relation with the first semiconductor region between the first semiconductor region and part of the first cladding region; and a first electrode and a second electrode for injecting a current into the quantum-well structure region.

According to a seventh aspect of the present invention, there is provided a semiconductor laser device comprising a semiconductor substrate; a region of quantum-well structure; a first cladding layer region on a side of the semiconductor substrate and a second cladding layer region disposed over a same side of the semiconductor substrate as that on which the first cladding layer region is on and with the region of quantum-well structure being intermediate that between the first cladding layer region and the second cladding layer region; a first semiconductor region formed by ion implantation and disposed on either side of a resonator-forming region of the quantum-well structure region, the side of the resonator-forming region being in parallel with a traveling direction of light, and the first semiconductor region having an electric resistance higher than that of the quantum-well structure region and being capable of guiding light; an insulative or semi-insulative epitaxial semiconductor layer region formed in a self-aligned relation with the first semiconductor region between the first semiconductor region and part of the first cladding region; and a first electrode and a second electrode for injecting a current into the quantum-well structure region.

According to an eighth aspect of the present invention, there is provided a semiconductor laser array device comprising a plurality of semiconductor laser sections disposed on a semiconductor substrate, each of the semiconductor laser sections comprising a first cladding region on a side of the semiconductor substrate; an active layer region; a second cladding region disposed over a same side of the semiconductor substrate as that on which the first cladding region is on and with the active layer region being intermediate that between the semiconductor substrate and the second cladding region; a first semiconductor region on either side of the active layer region in parallel with a traveling direction of light in the active layer region, the first semiconductor region having an electric resistance higher than that of the active layer region and a refractive index higher than that of the semiconductor substrate; an insulative or semi-insulative second semiconductor region formed between the first semiconductor region and part of the second cladding region; and a first electrode and a second electrode for injecting a current into the active layer region.

According to a ninth aspect of the present invention, there is provided a semiconductor laser array device comprising a plurality of single mode oscillation semiconductor laser sections having oscillation wavelengths different from each other disposed on a semiconductor substrate, each of the single mode oscillation semiconductor laser sections comprising a first cladding region on a side of the semiconductor substrate; an active layer region; a second cladding region disposed over a same side of the semiconductor substrate as that on which the first cladding region is on and with the active layer region being intermediate that between the semiconductor substrate and the second cladding region; a first semiconductor region on either side of the active layer region in parallel with a traveling direction of light in the active layer region, the first semiconductor region having an electric resistance higher than that of the active layer region and a refractive index higher than that of the semiconductor substrate; an insulative or semi-insulative second semiconductor region formed between the first semiconductor region and part of the second cladding region; and a first electrode and a second electrode for injecting a current into the active layer region.

According to a tenth aspect of the present invention, there is provided a semiconductor laser array device comprising a plurality of semiconductor laser sections disposed on a semiconductor substrate, each of the semiconductor laser sections comprising a first cladding region on a side of the semiconductor substrate; an active layer region; a second cladding region disposed over a same side of the semiconductor substrate as that on which the first cladding region is on and with the active layer region being intermediate that between the semiconductor substrate and the second cladding region; a first semiconductor region on either side of the active layer region in parallel with a traveling direction of light in the active layer region, the first semiconductor region having an electric resistance higher than that of the active layer region and a refractive index higher than that of the semiconductor substrate; an insulative or semi-insulative second semiconductor region formed between the first semiconductor region and part of the second cladding region; a first electrode and a second electrode for injecting a current into the active layer region; and a temperature control means in the vicinity of the active layer region. The temperature control means in the vicinity of the active layer region disclosed in this aspect of the present invention is applicable not only to the semiconductor laser array device but also to other forms of semiconductor laser devices or semiconductor laser array devices disclosed in the present specification. It is preferable to dispose the temperature control means on the upper surface of the active layer region rather than on its side. This is because the structure of the semiconductor laminate allows heat to produce greater effects in a vertical direction than in a lateral direction relative to the semiconductor substrate. A specific example of the temperature control means will be illustrated in the section of a third embodiment.

According to an eleventh aspect of the present invention, there is provided a semiconductor laser device or a semiconductor laser array device as set forth in the first to ninth aspects of the present invention, wherein at least one of a quantum-well layer and a barrier layer in the active layer region or the region of quantum-well structure is an n-type semiconductor layer. More specifically, it is preferable that the quantum-well active layer region is n-type modulation doped.

According to a twelfth aspect of the present invention, there is provided a semiconductor laser device or a semiconductor laser array device as set forth in the first to tenth aspects of the present invention, wherein an organic resin layer is disposed on the second semiconductor region, the insulative or semi-insulative epitaxial semiconductor layer region, or the second current blocking layer region. A polyimide-based resin is especially useful as the organic resin. It is preferable from a viewpoint of device mounting that the upper surface of the semiconductor laminate is made substantially flat by using the organic resin layer.

The semiconductor laser devices and the semiconductor laser array devices according to the present invention are extremely effective for use in optical systems, optical transmission systems, and the like.

First Embodiment

Figure 3A:
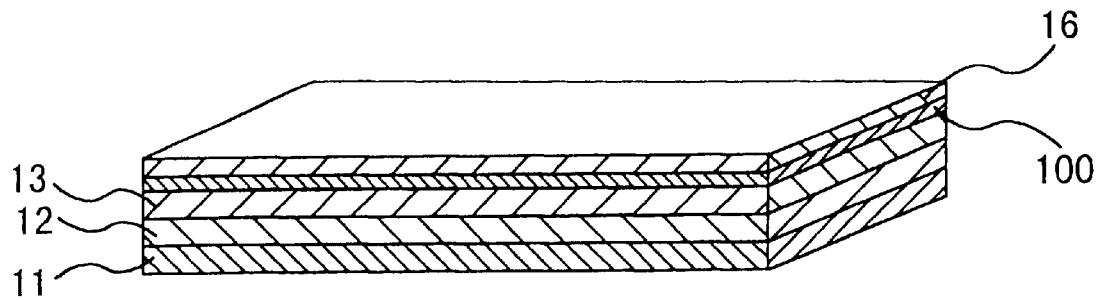
FIG. 3A is a perspective view of a representative embodiment for illustrating a fabrication process in the order of process steps.
Figure 3B:
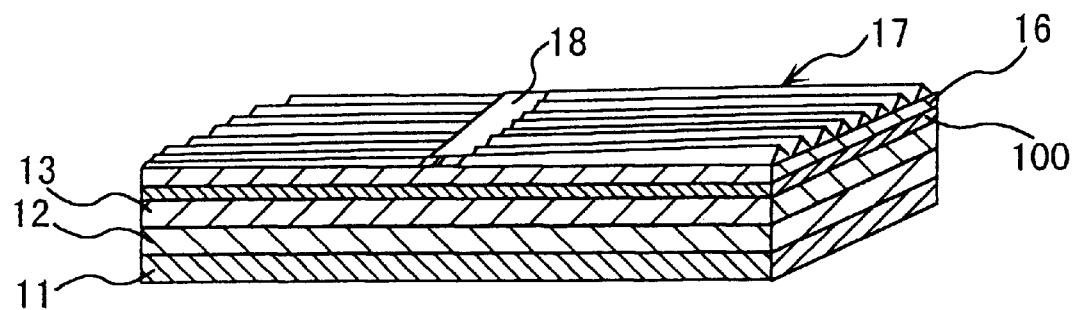
FIG. 3B is a perspective view of a representative embodiment for illustrating a fabrication process in the order of process steps.
Figure 3C:
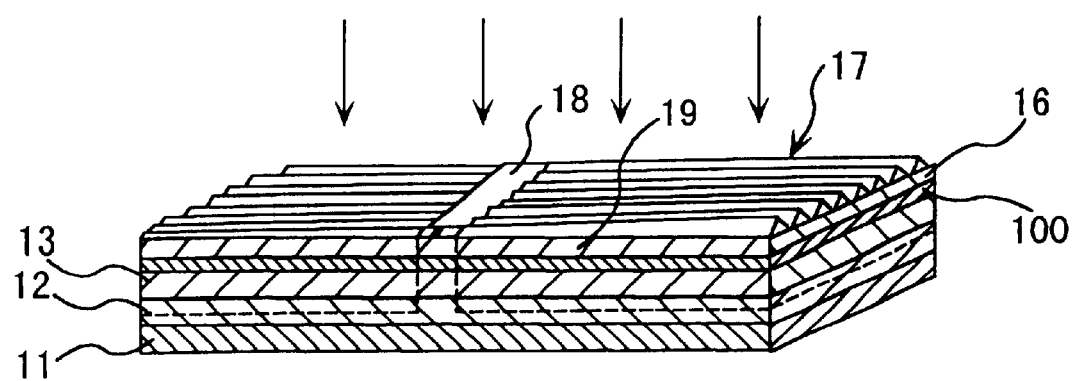
FIG. 3C is a perspective view of a representative embodiment for illustrating a fabrication process in the order of process steps.
Figure 3D:
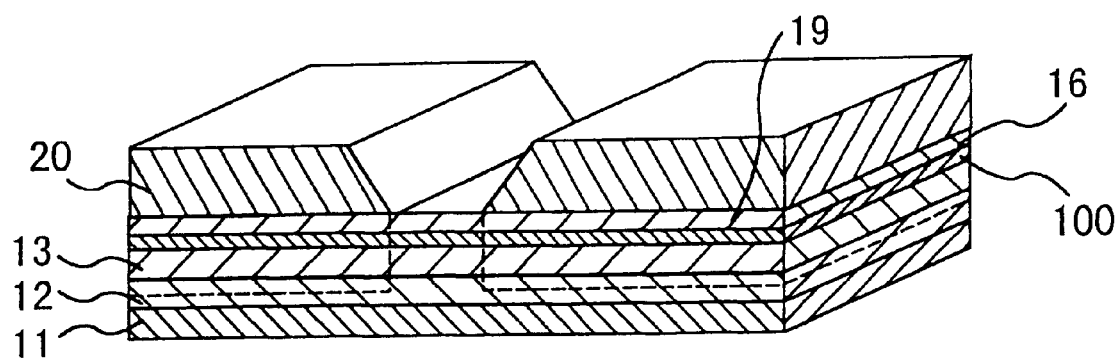
FIG. 3D is a perspective view of a representative embodiment for illustrating a fabrication process in the order of process steps.
Figure 3E:
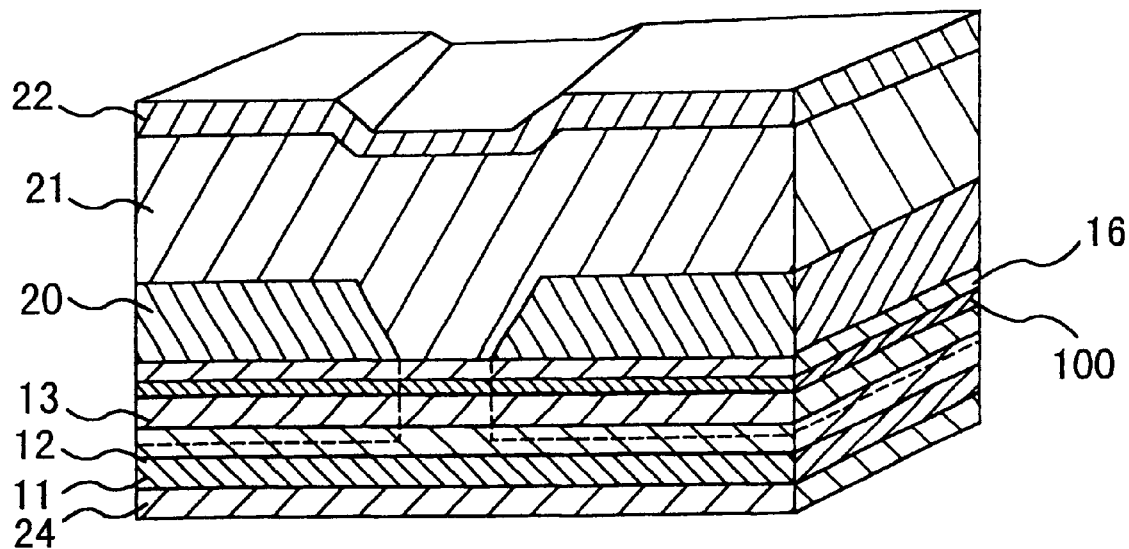
FIG. 3E is a perspective view of a representative embodiment for illustrating a fabrication process in the order of process steps.
Figure 4:
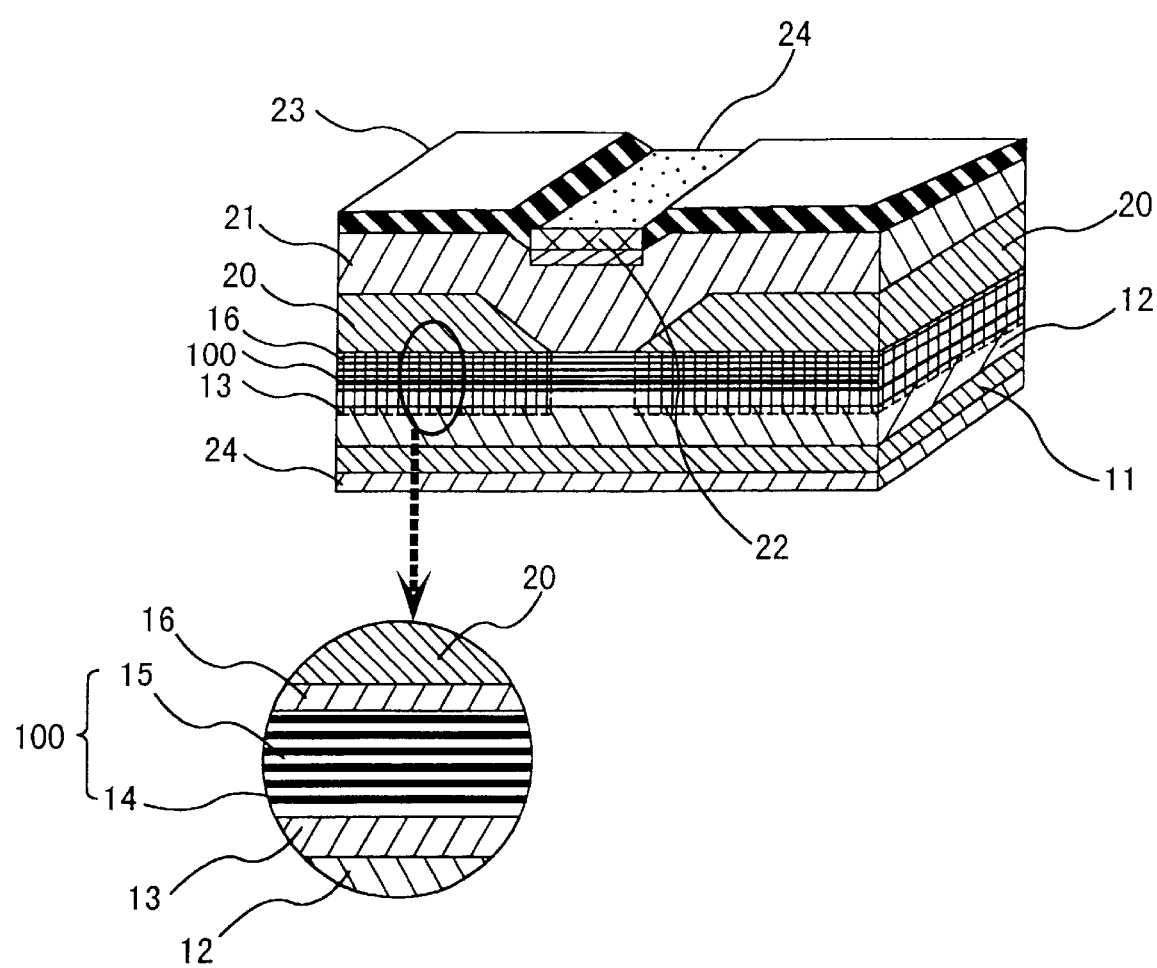
FIG. 4 is a perspective view of a representative embodiment.

FIGS. 3A, 3B, 3C, 3D, and 3E are perspective views of a semiconductor laminate for illustrating a process of producing a device of a first embodiment in the order of process steps. FIG. 4 is a perspective view of a completed semiconductor laser device. In FIG. 4, a partial enlarged view of the semiconductor laser device is shown in a circle. The first embodiment is an example of a semiconductor laser device having a first current blocking layer region and a second current blocking layer region.

A buffer layer 12 of n-type InP (a carrier density of $1\times10^{18}/cm^3$) is grown by 0.15 μm on an n-type InP substrate 11 (a carrier density of $1\times10^{18}/cm^3$). Then, an n-type InGaAsP lower guide layer 13 (a composition wavelength (λ.g=) or a photoluminescence peak wavelength in bulk of 1.15 μm, non-strained (Δa/a=0(%)) or unstrained MQW, and a carrier density of $1\times10^{18}/cm^3$) is grown to a thickness of 100 nm. Next, a strained multiple quantum-well waveguide structure 100 is grown. The strained multiple quantum-well waveguide structure 100 is a six-period structure of 6-nm InGaAsP strained quantum-well layers 14 (a composition wavelength of 1.67 μm and a compressive strain of 1.2%) and 10-nm InGaAsP barrier layers 15 (a composition wavelength of 1.15 μm and unstrained). Further, an InGaAsP upper guide layer 16 (a composition wavelength of 1.15 μm and unstrained) is grown by 70 nm (FIG. 3A). Incidentally, a cross section in the circle in FIG. 4 shows a laminated state in the region of the strained multiple quantum-well waveguide structure 100.

Then, a diffraction grating structure 17 is formed on the prepared semiconductor laminate by a known method. In order to facilitate understanding, the section of the diffraction grating is shown in enlarged dimension in FIG. 3B. An SiO$_2$ film is deposited on the diffraction grating structure 17, and a photoresist in a stripe form 18 is formed on the SiO$_2$ film. The width of the stripe 18 in this case is 2.0 μm. Further, the SiO$_2$ film is etched with the region of the photoresist serving as a mask region (FIG. 3B). Thus, a resonator in this case is of the DFB type.

Then, iron ions are implanted at an accelerating voltage of 40 KeV and a dose of $1\times10^{13}/cm^2$. Thus, a first current blocking layer region 19 is formed (FIG. 3C). The first current blocking layer region 19 has an electric resistance different from that of an active layer region as a result of iron ion implantation, and has a refractive index higher than that of a substrate material.

After the photoresist is removed, the laminate is subjected to normal heat treatment for reduction of defects. Then, an iron-doped semi-insulating InP layer 20 with a film thickness of 0.7 μm is formed by crystal growth (FIG. 3D). The InP layer 20 corresponds to a second current blocking layer region according to the present invention. Since the InP layer 20 contains iron, the InP layer 20 is semi-insulative, and therefore has electrical properties sufficient to achieve an object of the present invention. In addition, the InP layer 20 is selectively grown on the substrate having the SiO$_2$ film 18 in a stripe form, and therefore the width of the InP layer 20 is determined through self-alignment with the first current blocking layer region 19 formed by iron ion implantation.

After the mask of the SiO$_2$ film deposited in the stripe form 18 is removed, a 1.5-μm thick beryllium-doped p-type InP cladding layer 21 (a carrier density of $1.5\times10^{18}/cm^3$) is regrown. Thereafter, a high-density InGaAs contact layer 22 (a doping amount of $1.5\times10^{19}/cm^3$) is grown to a thickness of 0.2 μm (FIG. 3E).

Finally, an SiO$_2$ film 23 is deposited as a usual passivation film, and also a first electrode 24 and a second electrode 24' are formed. Then, both sides of the crystal are cleaved. A normal reflective film is deposited on both of the front and rear sides of the cleaved sides (FIG. 4). Incidentally, the reflective film is not shown in FIG. 4.

The oscillation threshold current and the oscillation wavelength of the semiconductor laser device in the first embodiment are 8 mA and 1551 nm, respectively. According to the first embodiment, effects of variations in active region width are substantially avoided, and the yield of oscillation wavelength in fabrication is improved.

Second Embodiment

Figure 5:
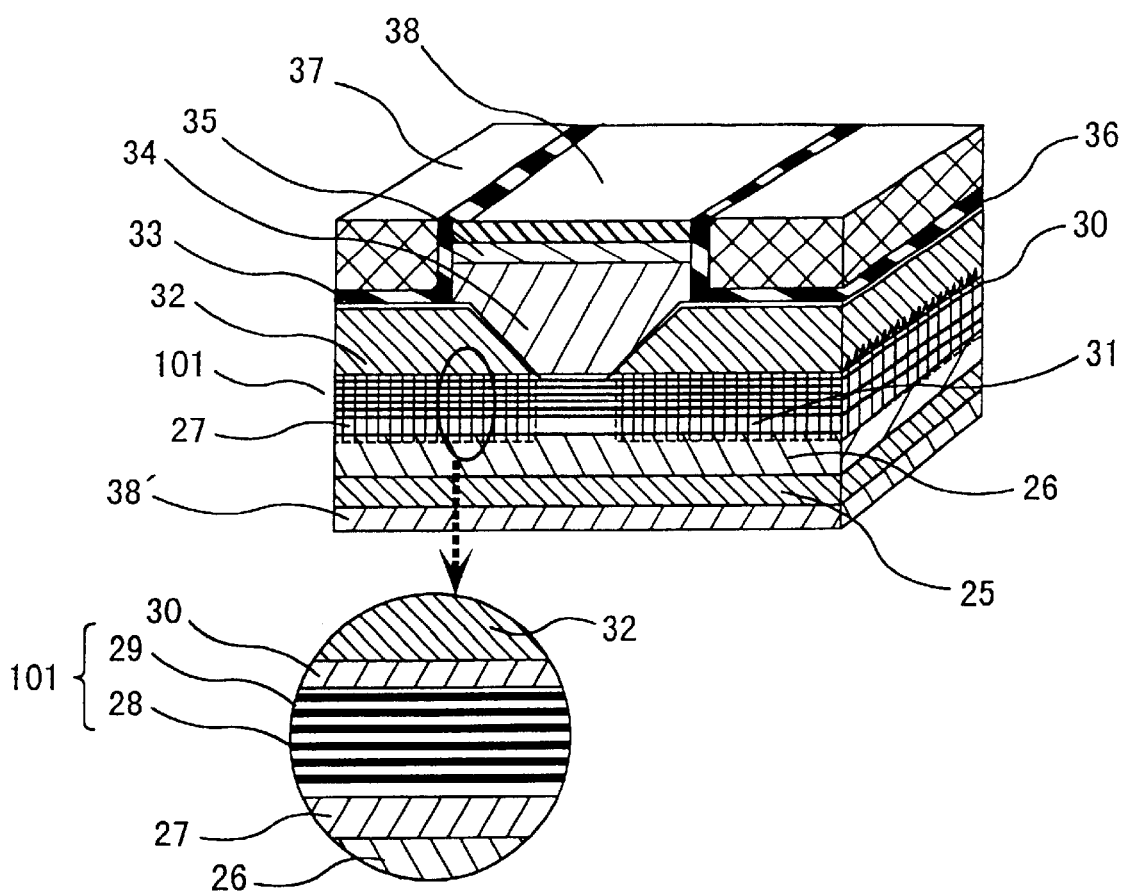
FIG. 5 is a perspective view of another embodiment.

FIG. 5 is a perspective view of a completed semiconductor laser device of a second embodiment. In FIG. 5, a partial enlarged view of the semiconductor laser device is shown in a circle. The second embodiment is an example in which an active layer region is an n-type modulation doped MQW.

The basic fabrication process of the second embodiment is the same as that of the first embodiment described above. A buffer layer 26 of n-type InP (a carrier density of $1\times10^{18}/cm^3$) is grown by 0.15 μm on an n-type InP substrate 25 (a carrier density of $1\times10^{18}/cm^3$). Then, an n-type InGaAsP lower guide layer 27 (a composition wavelength of 1.15 μm, unstrained MQW, and a carrier density of $1\times10^{18}/cm^3$) is grown to a thickness of 100 nm. Next, a strained multiple quantum-well waveguide structure is grown. The strained multiple quantum-well waveguide structure is a six-period structure of 6-nm InGaAsP strained quantum-well layers 28 (a composition wavelength of 1.67 μm and a compressive strain of 1.2%) and 10-nm n-type InGaAsP barrier layers 29 (a composition wavelength of 1.15 μm, unstrained, and a carrier density of $3\times10^{17}/cm^3$). Incidentally, a cross section in the circle in FIG. 5 shows a laminated state in the region of the strained multiple quantum-well waveguide structure 101.

Further, an InGaAsP upper guide layer 30 (a composition wavelength of 1.15 μm and unstrained) is grown by 70 nm. Then, a diffraction grating structure is formed on the prepared semiconductor laminate by a usual method. A SiN film is deposited on the diffraction grating structure, and a photoresist in a stripe form is formed on the SiN film. The width of the stripe in this case is 2.0 μm. Further, the SiN film is etched with the photoresist serving as a mask region.

Then, iron ions are implanted at an accelerating voltage of 40 KeV and a dose of $1\times10^{13}/cm^2$. Thus, a first current blocking layer region 31 is formed. After the photoresist is removed, the laminate is subjected to heat treatment for reduction of defects.

A 0.7 μm thick semi-insulating InP 32 doped with iron by regrowth and an undoped InGaAsP etch stopper layer 33 (a composition wavelength of 1.05 μm and unstrained) are sequentially grown. The InP layer 32 corresponds to a second current blocking layer region according to the present invention. Since the InP layer 32 contains iron, the InP layer 32 is semi-insulative, and therefore has electrical properties sufficient to achieve an object of the present invention. In addition, the InP layer 32 is selectively grown on the substrate having the SiN film in a stripe form, and therefore the width of the InP layer 32 is determined through self-alignment with the first current blocking layer region 31 formed by iron ion implantation.

After the mask of the SiN film for selective growth deposited on a mesa that functions as an active layer is removed, a 1.5-μm thick beryllium-doped p-type InP cladding layer 34 (a carrier density of $1.5 \times 10^{18}/cm^3$) and an InGaAs contact layer 35 are sequentially formed by recrystallization growth.

A stripe 4 μm wide is formed again directly above the active layer to perform etching down to the InGaAsP etch stopper layer 33. Thereafter, both sides of the mesa are filled with an $SiO_2$ film 36 and a polyimide resin 37. Also, a first electrode 38 and a second electrode 38' are formed. Then, both sides of the crystal are cleaved. A reflective film is deposited on both of the front and rear sides of the cleaved sides. Incidentally, the reflective film is not shown in FIG. 5.

The threshold current of the semiconductor laser in the second embodiment is 6 mA. The oscillation wavelength of the semiconductor laser is 1550.5 nm.

According to t he second embodiment, effects of variation s in active region width are substantially avoided, and the yield of oscillation wavelength in fabrication is improved. At the same time, in the second embodiment, by adopting the so-called n-type modulation doped structure formed by using an n- type semiconductor for its active layer, it is possible to make the threshold value still lower than that of a common quantum-well structure. N-type modulation doping may be adequately performed by introducing an n-type impurity into at least either the well layers or the barrier layers. In most cases, doping is performed on barrier layers.

Third Embodiment

Figure 6:
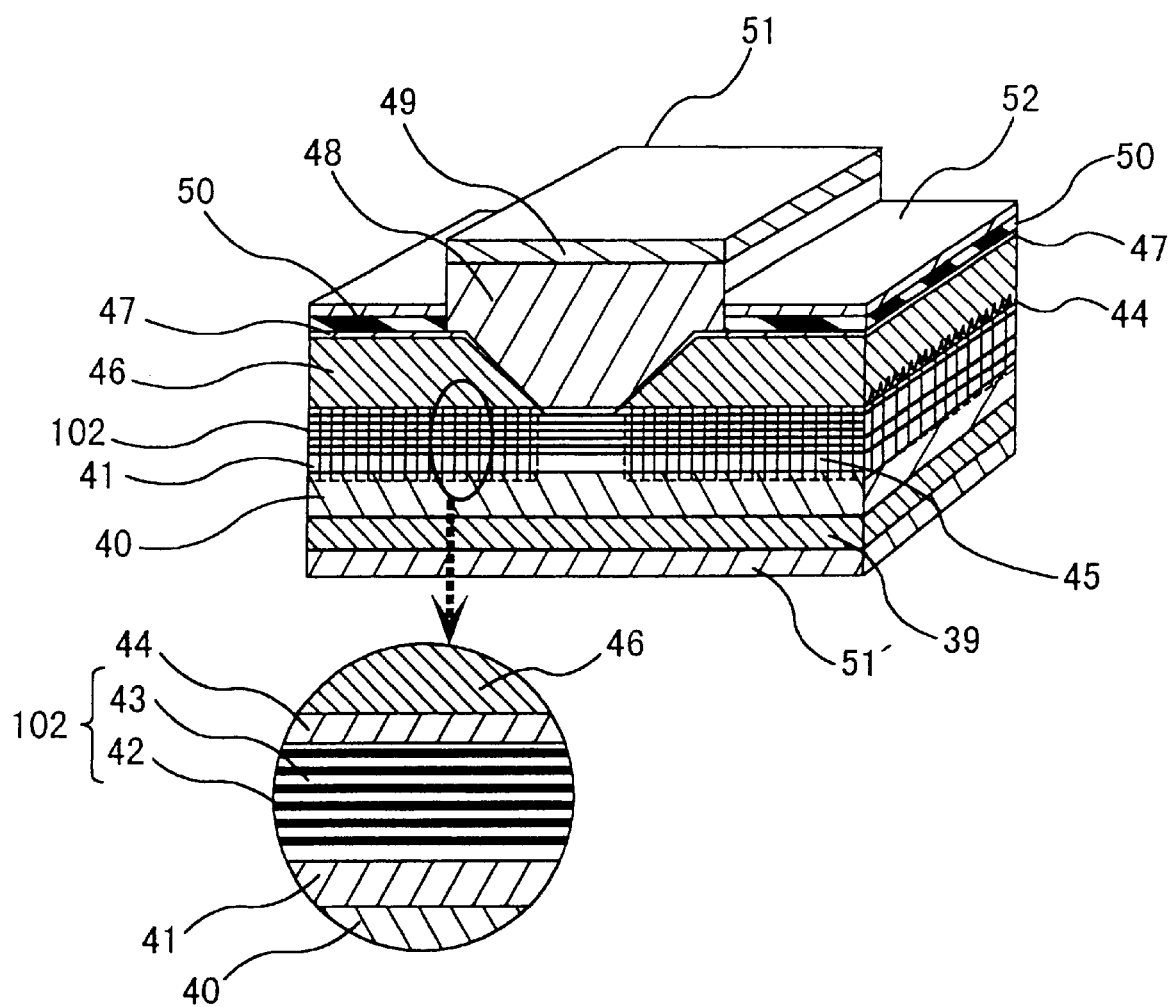
FIG. 6 is a perspective view of a further embodiment.

FIG. 6 is a perspective view of a completed semiconductor laser de vice of a third embodiment. In FIG. 6, a partial enlarged view of the semiconductor laser device is shown in a circle. The third embodiment is an example in which the semiconductor laser device is provided with a wavelength variable function among other things.

The basic fabrication process of the third embodiment is the same as that of the first embodiment or the second embodiment described above. A buffer layer 40 of n-type InP (a carrier density of $1 \times 10^8/cm^3$) is grown by 0.15 μm on an n-type InP substrate 39 (a carrier density of $1 \times 10^{18}/cm^3$). Then, an n-type InGaAsP lower guide layer 41 (a composition wavelength of 1.15 μm, unstrained MQW, and a carrier density of $1 \times 10^{18}/cm^3$) is grown to a thickness of 100 nm. Next, a strained multiple quantum-well waveguide structure 102 is grown. The strained multiple quantum-well waveguide structure 102 is a six-period structure of 6-nm InGaAsP strained quantum-well layers 42 (a composition wavelength of 1.67 μm and a compressive strain of 1.2%) and 10-nm n-type InGaAsP barrier layers 43 (a composition wavelength of 1.15 μm, unstrained, and a carrier density of $3 \times 10^{17}/cm^3$). Also in the third embodiment, n-type modulation doping is employed. Incidentally, a cross section in the circle in FIG. 6 shows a laminated state in the region of the strained multiple quantum-well waveguide structure 102. Further, an InGaAsP upper guide layer 44 (a composition wavelength of 1.15 μm and unstrained) is grown by a thickness of 70 nm.

Then, for a DFB type laser, a diffraction grating structure is formed by a usual method. A SiN film is deposited on the diffraction grating structure, and a photoresist is formed in a desired stripe form. The width of the stripe in this case is 2.0 μm. Then, the SiN film is etched with the photoresist serving as a mask region. Iron ions are thereafter implanted at an accelerating voltage of 40 KeV and a dose of $1 \times 10^{13}/cm^2$. Thus, a first current blocking layer region 45 is formed.

After the photoresist is removed, the laminate is subjected to usual heat treatment for reduction of defects.

A 0.7-μm thick semi-insulating InP layer 46 doped with iron by crystal growth and an undoped InGaAsP etch stopper layer 47 (a composition wavelength of 1.05 μm and unstrained) are sequentially grown. The InP layer 46 corresponds to a second current blocking layer region according to the present invention. Since the InP layer 46 contains iron, the InP layer 46 is semi-insulative, and therefore has electrical properties sufficient to achieve an object of the present invention. In addition, the InP layer 46 is selectively grown on the substrate having the SiN film in a stripe form, and therefore the width of the InP layer 46 is determined through self-alignment with the first current blocking layer region 45 formed by iron ion implantation.

After the mask of the SiN film deposited on a mesa that functions as an active layer is removed, a 1.5-μm thick beryllium-doped p-type InP cladding layer 48 (a carrier density of $2 \times 10^{18}/cm^3$) is regrown. Thereafter, a high-density InGaAs contact layer 49 (a doping amount of $1.5 \times 10^{19}/cm^3$) is grown to a thickness of 0.2 μm.

A stripe with a width of 4 μm is formed again directly above the active layer to perform etching down to the InGaAsP etch stopper layer 47 (a composition wavelength of 1.15 μm and unstrained). An $SiO_2$ dielectric film 50, an upper electrode 51, a thin-film heater 52, and a lower electrode 51' are thereafter formed. Then, both sides of the crystal are cleaved. A reflective film is deposited on both of the front and rear sides of the cleaved sides. Incidentally, the reflective film is not shown in FIG. 6.

In the third embodiment, the oscillation wavelength of the semiconductor laser device is made thermally variable by providing a temperature control means, for example, the heater 52 as mentioned above in the vicinity of the oscillation active layer region. Thus, when the oscillation wavelength of the semiconductor optical device is varied due to a rise in the temperature of the environmental atmosphere or the semiconductor optical device itself, the semiconductor optical device can be controlled to a desired normal oscillation wavelength. In specific operation, the oscillation wavelength of the semiconductor laser is monitored to detect a deviation of the oscillation wavelength from a predetermined wavelength and input a signal to the temperature control means. In response to the signal, current of the temperature control means, for example, the heater is controlled to adjust the oscillation wavelength of the semiconductor laser to a specified value.

In the third embodiment, the heater for temperature control is disposed on both sides of the active layer region that are in parallel with a traveling direction of light; however, the heater may be disposed on top of the active layer region. Even when thermal effects are produced from the top of the active layer region, a wavelength variable function, which is characteristic of the third embodiment, can be adequately realized. Specific materials for the heater as the temperature control means of the present invention include platinum (PT) and titanium (Ti). Although the film thickness, the width, and the like of heater material depend on a required level of heat power, the thickness of platinum is about 100 nm to 400 nm and that of titanium is about 50 nm to 100 nm in many cases. A usual deposition method is sufficient as a fabrication method for the heater. The operating temperature of the laser light emitting portion is controlled by passing a current through the heater.

It should be understood that it is a known phenomenon that oscillation wavelength is made variable through thermal control.

In the third embodiment, the oscillation threshold current is 8 mA. Moreover, a wavelength variable range of 3 nm can be achieved by controlling the temperature of the active layer region while heating the provided heater in a desired manner.

By applying the present invention to a wavelength variable type laser, it is possible to obtain a high-performance transmitting optical source for a wavelength division multiplexing transmission system that can provide a highly reliable oscillation wavelength.

It is to be understood that an n-type modulation doped region is used as the active layer region of the third embodiment; however, the wavelength variable function can be realized also by using a quantum-well structure, a strained quantum-well structure, a strain-compensated quantum-well structure or the like that is commonly employed.

Fourth Embodiment

Figure 7:
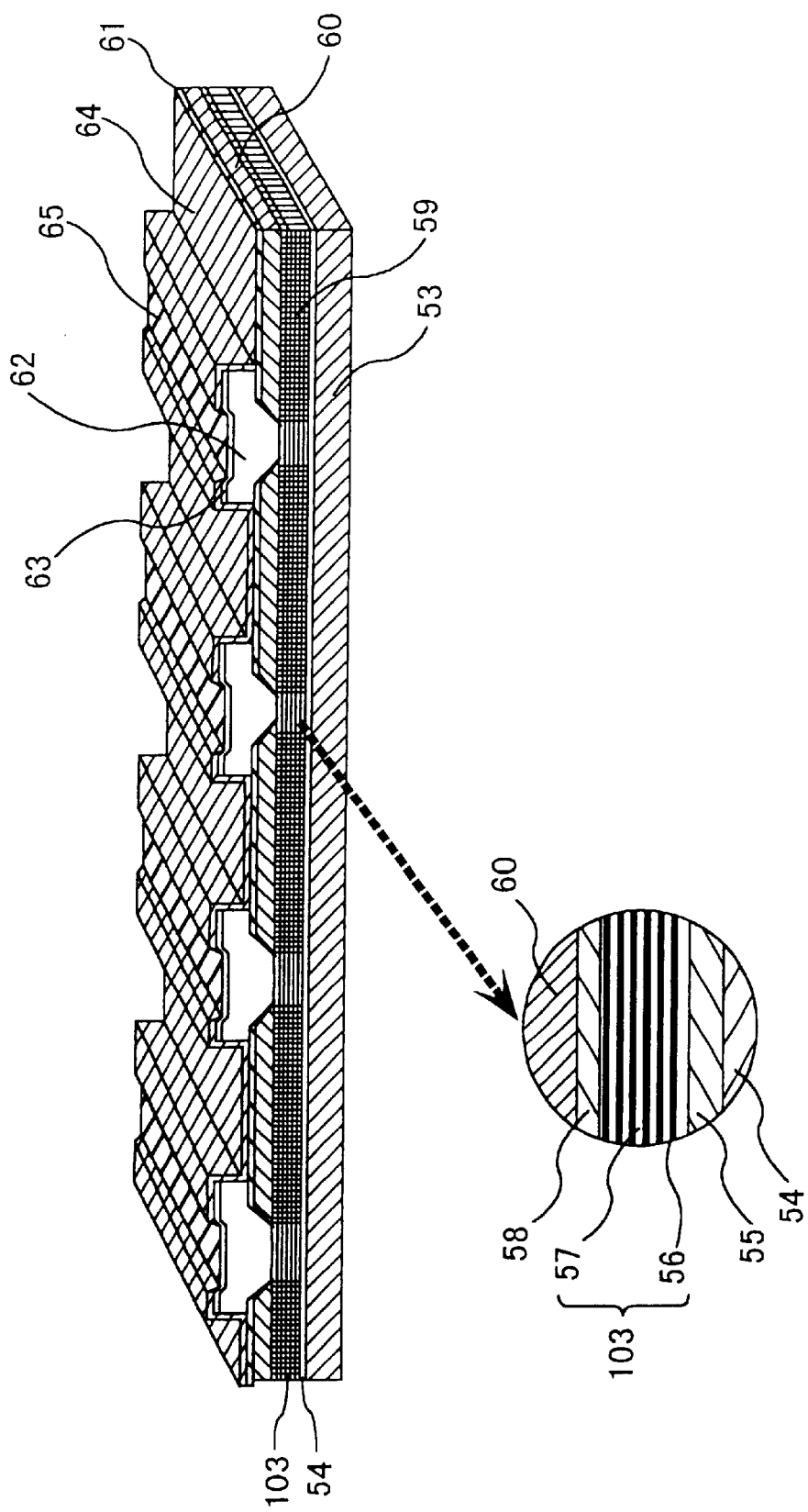
FIG. 7 is a perspective view of a semiconductor laser array device.

FIG. 7 is a perspective view of a completed semiconductor laser array device of a fourth embodiment. In FIG. 7, a partial enlarged view of the semiconductor laser array device is shown in a circle. The fourth embodiment is an example of a semiconductor laser array device in which transmitting optical sources for four channels in wavelength division multiplexing transmission are integrated.

The basic fabrication process of the fourth embodiment is the same as that of the first embodiment, the second embodiment or the like described above except that a plurality of light emitters are formed on a single substrate. Formation itself of a so-called laser array by providing a plurality of light emitters on a single substrate may be realized by using a similar method to that of fabricating a normal semiconductor laser array device. In the fourth embodiment, it suffices to add a process step of forming a first current blocking layer region and a second current blocking layer region according to the present invention.

A buffer layer 54 of n-type InP (a carrier density of $1\times10^{18}/cm^3$) is grown by 0.15 $\mu$m on an n-type InP substrate 53 (a carrier density of $1\times10^{18}/cm^3$). Then, an n-type InGaAsP lower guide layer 55 (a composition wavelength of 1.15 $\mu$m, unstrained MQW, and a carrier density of $1\times10^{18}/cm^3$) is grown to a thickness of 100 nm. Next, a strained multiple quantum-well waveguide structure 103 is grown. The strained multiple quantum-well waveguide structure 103 is a six-period structure of 6-nm InGaAsP strained quantum-well layers 56 (a composition wavelength of 1.67 $\mu$m and a compressive strain of 1.2%) and 10-nm InGaAsP barrier layers 57 (a composition wavelength of 1.15 $\mu$m and unstrained). Incidentally, a cross section in the circle in FIG. 7 shows a laminated state in the region of the strained multiple quantum-well waveguide structure 103. Further, an InGaAsP upper guide layer 58 (a composition wavelength of 1.15 $\mu$m and unstrained) is grown by a thickness of 70 nm.

An $SiO_2$ film is deposited on the upper guide layer, and a photoresist in a desired stripe form is formed on the $SiO_2$ film. The direction of the stripe is in parallel with a traveling direction of light. In this case, a spacing between stripes is 300 $\mu$m, and the width of a stripe is 2.0 $\mu$m.

Then, the $SiO_2$ film is etched with the photoresist serving as a mask region. Iron ions are thereafter implanted at an accelerating voltage of 40 KeV and a dose of $1\times10^{13}/cm^2$. Thus, a first current blocking layer region 59 is formed.

After the photoresist is removed, the laminate is subjected to usual heat treatment for reduction of defects. A semi-insulating InP 60 doped with iron by crystal regrowth is grown to a film thickness of 0.7 $\mu$m, and an undoped InGaAsP etch stopper layer 61 (a composition wavelength of 1.15 $\mu$m and unstrained) is grown by 30 nm.

Then, the $SiO_2$ film of the mask region, which is deposited on a mesa that serves as an active layer, is removed. A diffraction grating is thereafter formed on each stripe by a known method while sequentially varying wavelengths that correspond to the respective stripes. The diffraction gratings thus formed correspond to 236.3 nm, 236.5 nm, 236.6 nm, and 236.8 nm, respectively. An electron beam printing apparatus is used for this processing.

Next, a 1.3-$\mu$m thick beryllium-doped p-type InP cladding layer 62 (a carrier density of $2\times10^{18}/cm^3$) is regrown. Thereafter, a high-density InGaAs contact layer 63 (a doping amount of $1.5\times10^{19}/cm^3$) is grown to a thickness of 0.2 $\mu$m.

A stripe mask of $SiO_2$ film with a width of 4 $\mu$m is formed again directly above the active layer to perform etching down to the InGaAsP etch stopper layer 61 (a composition wavelength of 1.15 $\mu$m and unstrained). An $SiO_2$ dielectric film 64, a first electrode 65, and a second electrode 65' are thereafter formed. After both sides of the crystal are cleaved, a reflective film is deposited on both of the front and rear sides of the resonator. The reflective films are not shown in FIG. 7.

The oscillation wavelengths of the four-channel semiconductor laser array according to the fourth embodiment are 1550 nm, 1551 nm, 1552 nm, and 1553 nm. The yield of semiconductor laser array devices having desired oscillation wavelengths and wavelength spacing has been improved by applying the present invention.

In the fourth embodiment, four light emitters are provided; however, an arbitrary number of light emitters can be provided. In addition, as to the quantum-well structure, the structures mentioned in the first to third embodiments can be employed as necessary. An n-type doped structure can also be employed as the active layer.

Furthermore, a wavelength variable means can of course be used in the laser array device of the fourth embodiment. Such an oscillation wavelength control means is extremely useful for a semiconductor laser array device having a plurality of wavelengths as of the fourth embodiment.

Fifth Embodiment

In a fifth embodiment, an example of a transmission module provided with a semiconductor laser array device according to the present invention will be illustrated. The fifth embodiment is an example in which an optical fiber transmission system with a built-in waveguide type optical modulator having a wavelength band of 1.55 $\mu$m is used.

Figure 8:
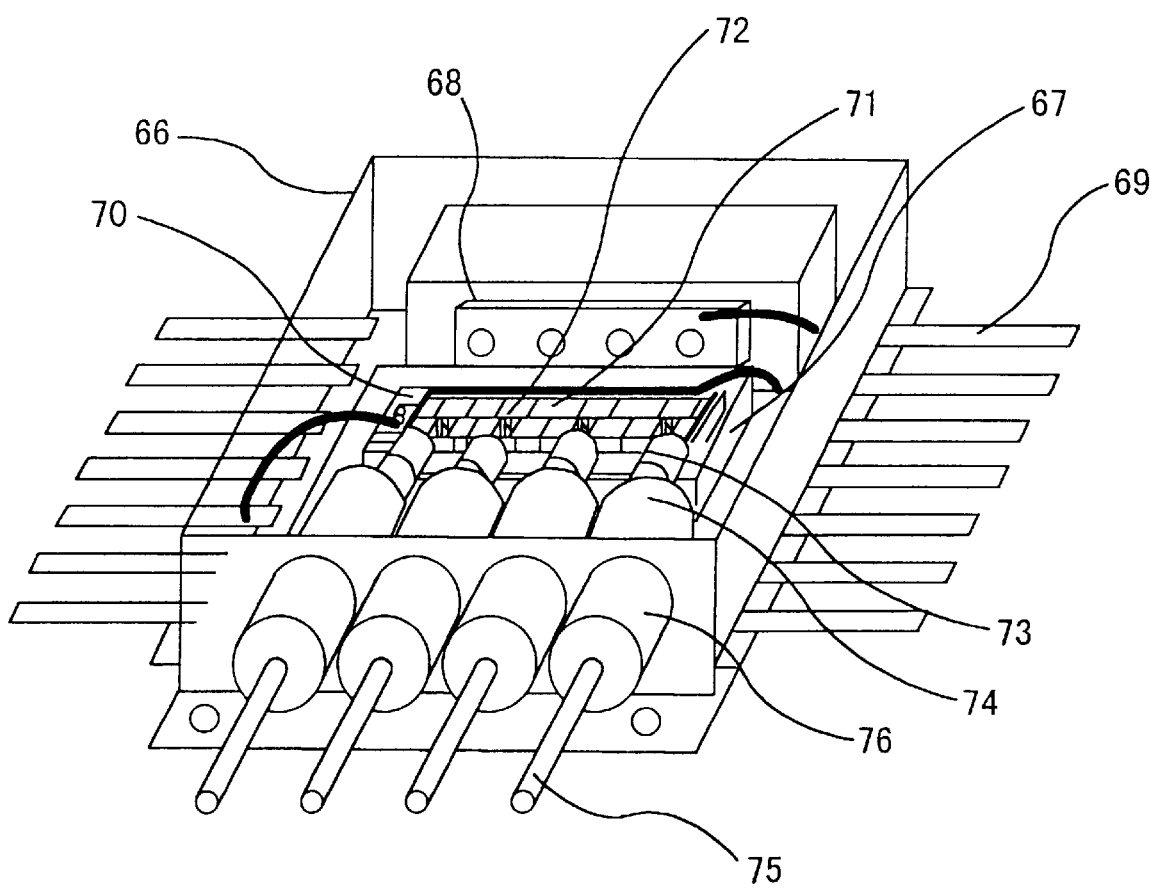
FIG. 8 is a perspective view of a module mounted with a semiconductor optical device.

FIG. 8 is a perspective view of a multiple wavelength transmission system using the present invention. The figure shows a schematic configuration of the multiple wavelength transmission system.

A fundamental configuration of the optical fiber transmission system is briefly described as follows. An optical fiber 75 housed in a fiber sleeve 76 is extended to the outside from one wall surface of a casing 66. The optical fiber 75 is optically connected with an optical isolator 74 and an optical lens 73, and a semiconductor optical device 71 is mounted next to the optical lens 73. The semiconductor optical device 71 is mounted on a semiconductor optical device mounting substrate 70, and the semiconductor optical device 71 and the semiconductor optical device mounting substrate 70 are mounted on a temperature regulator 67. The temperature regulator 67 is a heat sink. In some cases, a Peltier element or a combination of a Peltier element and a heat sink is used for the temperature regulator 67. It should be noted that the temperature regulator is used to regulate the temperature of the whole semiconductor laser device, and therefore is different from a control means for fine adjustment of oscillation wavelength as described above. The configuration of the semiconductor optical device 71 itself will be described later in detail. As required, a monitoring photodetector 68 is provided on the opposite wall surface side of the casing 66 so as to face the semiconductor optical device 71. Also, a desired pin 69 is drawn to the outside from a side wall of the casing 66. The casing 66, the temperature regulator 67, the monitoring photodetector 68, the pin 69, the optical lens 73, the optical isolator 74, the optical fiber 75, the fiber sleeve 76 and the like themselves are adequately formed by using heretofore known techniques. A semiconductor optical device 71 for optical communication, for example, is usually formed by using either InP/InGaAsP material or InP/InGaAlAs material, or a combination of both. The semiconductor laser array device described in the fourth embodiment in particular makes it possible to reduce cost of the optical module of the fifth embodiment. The structure of the semiconductor laser array device itself has been explained in detail in the fourth embodiment, and therefore its description will be omitted here.

The aspect of optical devices has been described in detail so far; however, when the fifth embodiment is viewed from the aspects of an optical system and an optical fiber transmission system, cost per single channel in a wavelength division multiplexing transmission system is reduced as a result of application of the present invention. Thus, it is possible to reduce cost of components in a wavelength division multiplexing transmission module.

Sixth Embodiment

Figure 9:
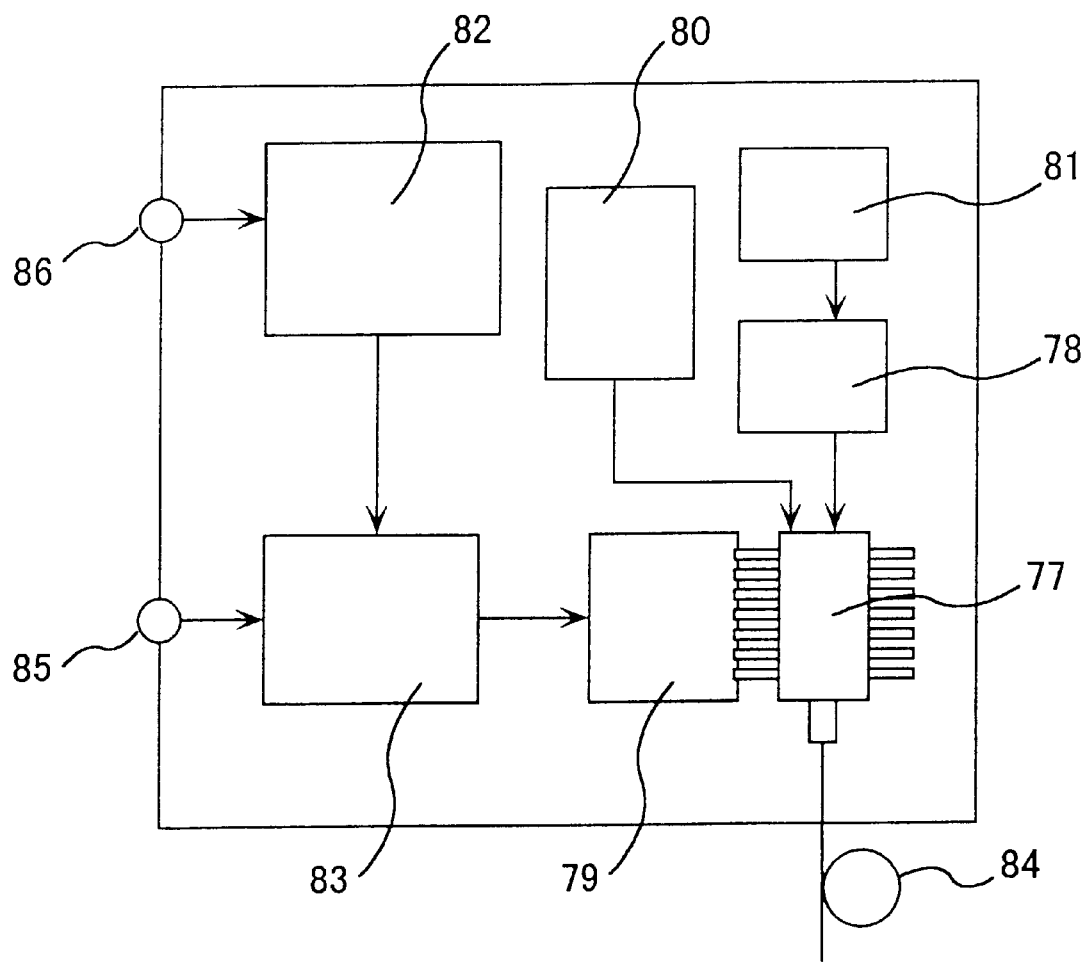
FIG. 9 is a diagram of an optical system.

FIG. 9 shows an example of an optical fiber transmission system provided with a semiconductor laser array device according to the present invention. The sixth embodiment is an example in which an optical fiber transmission system having a wavelength band of 1.55 μm is fabricated.

In the optical fiber transmission system, an optical transmission module 77 transmits light through an optical fiber 75. For the optical transmission module 77, the optical light emitting devices described so far may be used. The optical transmission module 77 has a semiconductor laser section and an optical modulator region, and in order to drive the semiconductor laser section and the optical modulator region, a laser driving circuit 78 and an optical modulator driver 79 are connected to the module. Also, a normal optical output stabilizing circuit 81 is provided for the semiconductor laser section. Furthermore, temperature control means provided for the semiconductor laser section and the optical modulator region are connected with a wavelength control circuit and a modulator temperature control circuit, respectively. The optical transmission module 77 is mounted on the temperature control means comprising Peltier elements. The optical transmission module 77 thus comprised is connected to a temperature stabilizing circuit 80.

In response to signals inputted to input terminals 85 and 86 of the optical fiber transmission system including the optical modulator driver 79, a clock generator 82 inputs a signal for optical communication to a multiplexer 83 together with a clock signal. A given signal is inputted to the modulator driver 79 by the multiplexer 83, and then a modulating signal is inputted to the target optical communication module 77. Incidentally, configurations of the parts of the optical communication module except the optical sources are similar to those of a known optical communication module, and therefore their detailed description will be omitted.

The configuration described above makes it possible to increase the number of channel wavelengths and realize a highly reliable transmitting optical source system for wavelength division multiplexing transmission at low manufacturing cost.

Cost for a single channel in a dense wavelength division multiplexing transmission system is reduced by applying the present invention.

According to the present invention, it is possible to provide semiconductor laser devices and semiconductor laser array devices that can ensure high-precision oscillation wavelengths. In addition, according to the present invention, it is possible to provide semiconductor laser devices and semiconductor laser array devices that are less affected by the atmospheric temperature while ensuring high-precision oscillation wavelengths. According to the present invention, it is possible to provide semiconductor laser devices and semiconductor laser array devices that have the effects described above and also ensure a certain yield level in fabrication.

Furthermore, according to the present invention, it is possible to provide optical systems or optical fiber transmission systems that enable transmission at stable wavelengths.

What is claimed is:

1. A semiconductor laser device comprising:
    a semiconductor substrate;
    a first cladding region on a side of said semiconductor substrate;
    an active layer region formed as a laminate structure including a quantum-well;
    a second cladding region disposed over a same side of said semiconductor substrate as that on which said first cladding region is on and with said active layer region being intermediate that between said semiconductor substrate and said second cladding region;
    a first semiconductor region on either side of said active layer region in parallel with a traveling direction of light in the active layer region, said first semiconductor region having an electric resistance higher than that of said active layer region and a refractive index higher than that of said semiconductor substrate,
        wherein said first semiconductor region is formed by implanting Fe ions into said active layer region laminate structure;
    an insulative or semi-insulative second semiconductor region formed between said first semiconductor region and part of said second cladding region; and
    a first electrode and a second electrode for injecting a current into said active layer region.

2. A semiconductor laser device as claimed in claim 1, wherein said second semiconductor region is formed in a self-aligned relation with said first semiconductor region.

3. A semiconductor laser device as claimed in claim 1, wherein said first semiconductor region and said second semiconductor region function as current blocking-layer regions.

4. A semiconductor laser device as claimed in claim 3, wherein said second semiconductor region is formed in a self-aligned relation with said first semiconductor region.

5. A semiconductor laser device as claimed in claim 1, further including a temperature control means in the vicinity of said active layer region.

6. A semiconductor laser device comprising:

a semiconductor substrate;

a first cladding region on a semiconductor substrate side;

a region of quantum-well laminate structure;

a second cladding region disposed over a same side of said semiconductor substrate as that on which said first cladding region is on and with said region of quantum-well laminate structure being intermediate that between said semiconductor substrate and said second cladding region;

a first semiconductor region disposed on either side of a resonator-forming region of the quantum-well laminate structure region, said side of the resonator-forming region being in parallel with a traveling direction of light, and said first semiconductor region having an electric resistance higher than that of said quantum-well laminate structure region and a refractive index higher than that of said semiconductor substrate,
wherein said first semiconductor region is formed by implanting Fe ions into said quantum-well laminate structure;

an insulative or semi-insulative second semiconductor region formed between said first semiconductor region and part of said second cladding region; and a first electrode and a second electrode for injecting a current into said quantum-well structure region.

7. A semiconductor laser device as claimed in claim 6, wherein said second semiconductor region is formed in a self-aligned relation with said first semiconductor region.

8. A semiconductor laser device as claimed in claim 6, wherein said first semiconductor region and said second semiconductor region function as current blocking layer regions.

9. A semiconductor laser device as claimed in claim 8, wherein said second semiconductor region is formed in a self-aligned relation with said first semiconductor region.

10. A semiconductor laser device as claimed in claim 6, further including a temperature control means in the vicinity of said quantum-well structure region.

11. A semiconductor laser array device comprising:

a plurality of semiconductor laser sections disposed on a semiconductor substrate, each of said semiconductor laser sections comprising a first cladding region on a side of said semiconductor substrate;

an active layer region formed as a laminate structure including a quantum-well;

a second cladding region disposed over a same side of said semiconductor substrate as that on which said first cladding region is on and with said active layer region being intermediate that between the semiconductor substrate and the second cladding region;

a first semiconductor region on either side of said active layer region in parallel with a traveling direction of light in said active layer region, said first semiconductor region having an electric resistance higher than that of said active layer region and a refractive index higher than that of said semiconductor substrate,
wherein said first semiconductor region is formed by implanting Fe ions into said active layer region laminate structure;

an insulative or semi-insulative second semiconductor region formed between said first semiconductor region and part of said second cladding region; and a first electrode and a second electrode for injecting a current into said active layer region.

12. A semiconductor laser array device as claimed in claim 11, wherein said plurality of semiconductor laser sections provide single mode oscillations and have oscillation wavelengths different from each other, respectively.

13. A semiconductor laser array device as claimed in claim 11, further including a temperature control means in the vicinity of said active layer region.

* * * * *